(12) United States Patent
David et al.

(10) Patent No.: US 11,374,600 B1
(45) Date of Patent: Jun. 28, 2022

(54) SYSTEM, APPARATUS AND METHOD FOR MITIGATING DIGITAL INTERFERENCE WITHIN RADIO FREQUENCY CIRCUITRY

(71) Applicant: Silicon Laboratories Inc., Austin, TX (US)

(72) Inventors: Thomas Saroshan David, Lakeway, TX (US); Michael Johnson, Austin, TX (US); Paul Zavalney, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 17/160,835

(22) Filed: Jan. 28, 2021

(51) Int. Cl.
| | | |
|---|---|---|
| *H04B 1/10* | (2006.01) | |
| *G06F 1/10* | (2006.01) | |
| *G06F 13/20* | (2006.01) | |
| *G06F 13/42* | (2006.01) | |
| *H03L 7/081* | (2006.01) | |

(52) U.S. Cl.
CPC ............... *H04B 1/10* (2013.01); *G06F 1/10* (2013.01); *G06F 13/20* (2013.01); *G06F 13/4282* (2013.01); *G06F 2213/0042* (2013.01); *H03L 7/081* (2013.01)

(58) Field of Classification Search
CPC ... H04B 5/0037; H04L 47/41; H04W 72/0453
See application file for complete search history.

(56) References Cited

U.S. PATENT DOCUMENTS

| | | | |
|---|---|---|---|
| 9,083,354 B2 | 7/2015 | Islam et al. | |
| 10,461,787 B2 | 10/2019 | Matthews et al. | |
| 2009/0104913 A1* | 4/2009 | Karls | H04W 72/0453 455/450 |
| 2012/0219005 A1* | 8/2012 | Durve | H04L 47/41 370/400 |
| 2014/0226954 A1* | 8/2014 | Miyasaka | H04B 5/0037 386/230 |
| 2014/0226957 A1* | 8/2014 | Barton | H04N 21/4147 386/297 |

* cited by examiner

*Primary Examiner* — Getente A Yimer
(74) *Attorney, Agent, or Firm* — Trop, Pruner & Hu, P.C.

(57) ABSTRACT

In one example, an apparatus includes: a radio frequency (RF) receiver to receive an RF signal; a media access control (MAC) circuit to receive data and output MAC-processed data according to a clock signal that is phase delayed with respect to a source clock signal when the RF receiver is active; and an interference mitigation circuit to receive the MAC-processed data and provide the MAC-processed data to a physical circuit resynchronized to the source clock signal.

20 Claims, 7 Drawing Sheets

SYSTEM, APPARATUS AND METHOD FOR MITIGATING DIGITAL INTERFERENCE WITHIN RADIO FREQUENCY CIRCUITRY

BACKGROUND

Many integrated circuits (IC s) include feature rich digital and analog modules. In addition, some integrated circuits also include radio frequency (RF) components that can run in conjunction with the digital and analog modules. Such combinations can result in interference and degradation on the RF performance. While one solution is to prevent operation of RF components when the other modules are operating, such arrangement limits flexibility and reduces speed of operation.

SUMMARY OF THE INVENTION

In one aspect, an apparatus includes: a radio frequency (RF) receiver to receive an RF signal; a media access control (MAC) circuit to receive data and output MAC-processed data according to a clock signal that is phase delayed with respect to a source clock signal when the RF receiver is active; and an interference mitigation circuit to receive the MAC-processed data and provide the MAC-processed data to a physical circuit resynchronized to the source clock signal.

In an example, the interference mitigation circuit comprises: a latch to latch the MAC-processed data according to the phase-delayed clock signal when the RF receiver is active; and a flop coupled to the latch to clock the MAC-processed data according to the source clock signal. When the RF receiver is inactive, the latch is to latch the MAC-processed signal according to the source clock signal. The apparatus may further comprise a clock generation circuit to receive the source clock signal and to output the phase-delayed clock signal.

A controller may be configured to cause at least a portion of the clock generation circuit to be powered down when the RF receiver is inactive. In a first mode when the RF receiver is inactive, the clock generation circuit is to output the source clock signal to the MAC circuit and the interference mitigation circuit. In a second mode when the RF receiver is active, the clock generation circuit is to output the phase-delayed clock signal to the MAC circuit and the interference mitigation circuit. In a third mode after the RF receiver becomes inactive after being active, the clock generation circuit is to output a catchup clock signal to the MAC circuit and the interference mitigation circuit, the catchup clock signal having a higher frequency than the source clock signal. The clock generation circuit may switch between an output of the source clock signal and the output of the phase-delayed clock signal in a single cycle. The clock generation circuit may retime the source clock signal according to a local oscillator clock signal to generate the phase-delayed clock signal.

In another aspect, a method comprises: sending data from a MAC circuit of an integrated circuit (IC) to an interference mitigation circuit of the IC; handling the data in the interference mitigation circuit according to a phase-delayed clock signal when a RF receiver of the IC is active, and handling the data in the interference mitigation circuit according to an undelayed clock signal when the RF receiver is inactive; and forwarding the data from the interference mitigation circuit to a physical circuit of the IC according to the undelayed clock signal.

In an example, the method further comprises receiving the phase-delayed clock signal from a clock generation circuit of the IC. The method may further comprise phase delaying the undelayed clock signal in the clock generation circuit according to a local oscillator clock signal, the local oscillator clock signal used in the RF receiver.

In an example, the method may further comprise: latching the data through a latch of the interface mitigation circuit according to the phase-delayed clock signal when the RF receiver is active; and outputting the data from a flop circuit of the interference mitigation circuit according to the undelayed clock signal. The method may further comprise preventing interference between the undelayed clock signal and activity in the RF receiver via the phase-delayed clock signal. The method may further comprise sending the data from the physical circuit to a host processor coupled to the IC via a link.

In yet another aspect, a system includes: a host processor; and an integrated circuit coupled to the host processor via a USB link. The integrated circuit may include: a RF receiver to receive an RF signal; and an input/output (I/O) circuit to communicate with the host processor via the link. The I/O circuit may include: a MAC circuit to receive data and output MAC-processed data according to a retimed clock signal; a physical circuit coupled to the MAC circuit, the physical circuit to condition the MAC-processed data and output the conditioned MAC-processed data via the link; and an interference mitigation circuit to receive the retimed clock signal and a source clock signal and resynchronize the MAC-processed data to the source clock signal.

In an example, the system may further comprise a clock generation circuit to generate the retimed clock signal using the source clock signal and a local oscillator clock signal used by the RF receiver. When the RF receiver is inactive, the clock generation circuit may output the source clock signal as the retimed clock signal. The interference mitigation circuit may include: a latch to latch the MAC-processed data according to the retimed clock signal; and a flop coupled to the latch to clock the MAC-processed data according to the source clock signal.

DETAILED DESCRIPTION

In various embodiments, an integrated circuit includes different modules including digital and analog modules and further including at least one radio frequency module. To enable concurrent operation of at least some of these modules when the RF module is active, dynamic spur mitigation may be performed. More specifically, one or more digital clocks can be dynamically modified such that interference between harmonics of such clocks and activity within the RF circuitry is reduced or removed.

Digital clocking interference mitigation in accordance with an embodiment can be applied to a variety of different modules within an IC. For purposes of illustration herein, digital clock control for clock signals used in system and communication modules will be described, although other uses are possible.

Internal digital infrastructure clocks used for processing circuitry, memories, data buses, input/output (I/O) modules, among others, can reduce radio sensitivity. The amount of loss varies depending on system clock frequency and amount of overall internal digital activity. Interference mitigation circuitry can dynamically adjust one or more clocks and mitigate the amount of sensitivity loss, e.g., on the order of 0.2 dB to 1 dB.

Note that greater interference may occur as a result of external communications, such as input/output (I/O) data toggling at a fast rate, e.g., on the order of between approximately 10 to 80 MHz. The sensitivity loss may vary based on the frequency of the digital communication and proximity of the I/O circuitry to RF circuitry. In an embodiment, toggling an I/O circuit at high speed in proximity to radio circuitry may incur losses as great as 12 dB.

In embodiments, interference mitigation circuitry may be dynamically enabled when radio activity, particularly RF receiving activity, is detected. This interference mitigation circuitry may be configured to modify clocking of digital modules to reduce such interference. When this circuitry is enabled, one or more internal clock circuits may be controlled to output digital clock signals that are dynamically modified. In embodiments, this dynamic clock modification may include one or more of small phase shifts, cycle jitter, and/or small durations of increased frequency. Overall, the clock signals may be guaranteed to maintain an average target frequency and correct time base with no clock glitches. In this way, a constant time base may be realized in processing circuitry, timers, and communication modules among other such circuitry leveraging dynamically controlled clock signals.

Figure 1:
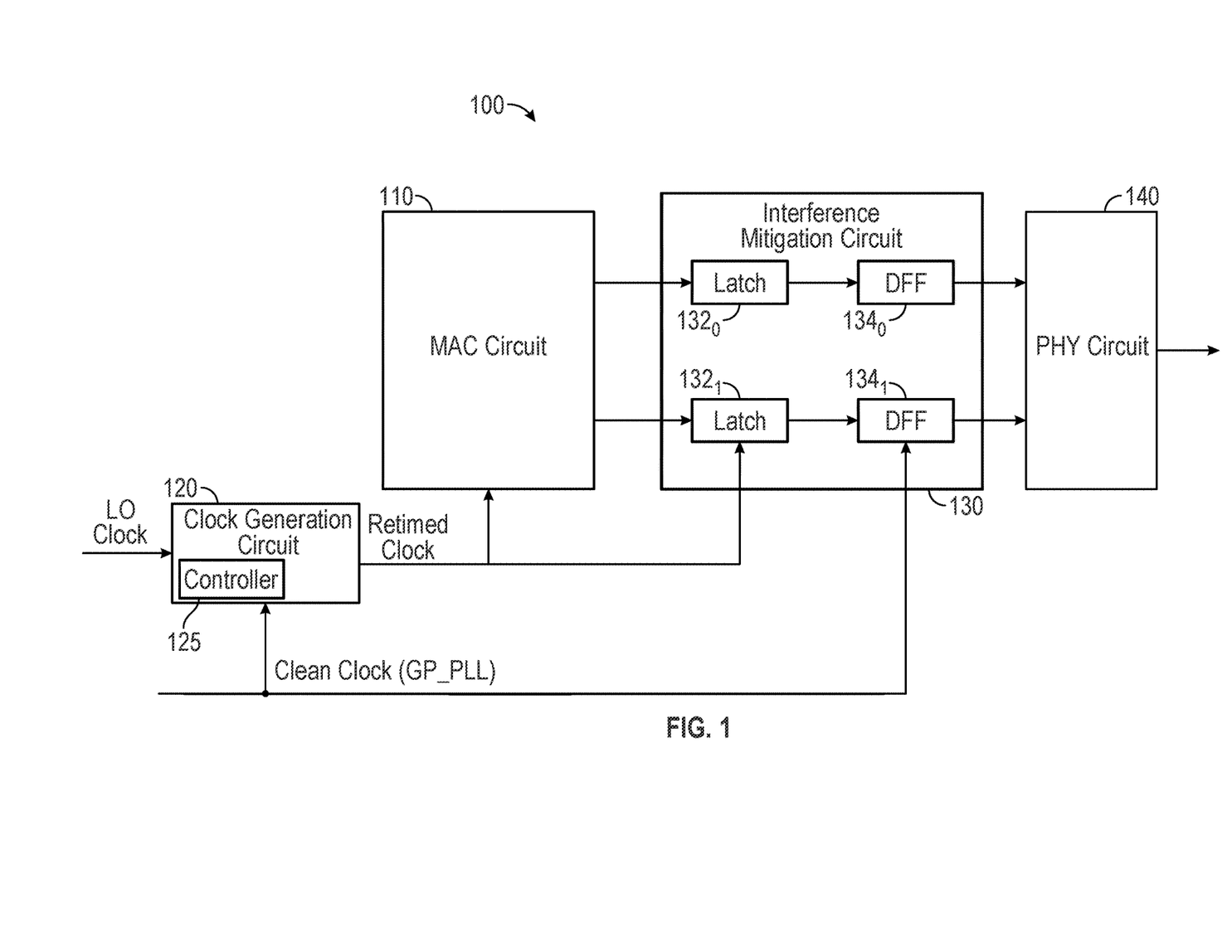
FIG. 1 is a block diagram of a portion of an integrated circuit in accordance with an embodiment.

Referring now to FIG. 1, shown is a block diagram of a portion of an integrated circuit in accordance with an embodiment. As shown in FIG. 1, IC 100 may be any type of circuit having analog and digital modules to perform various functionality including processing, sensing, metering or so forth. In some implementations, IC 100 may be an Internet of Things (IoT)-based device further including radio circuitry to enable wireless communication. In the high level shown in FIG. 1, a source of interference with such radio circuitry (which is not shown for ease of illustration in FIG. 1) is I/O circuitry. In FIG. 1, the I/O circuitry includes a media access control (MAC) circuit 110 that receives data from one or more source circuits (not shown in FIG. 1). MAC circuit 110 couples to an interference mitigation circuit 130 and in turn with a physical layer (PHY) circuit 140. With embodiments herein, interference within this I/O circuitry caused by one or more digital clocks may be reduced or removed.

As further illustrated in FIG. 1, a clock generation circuit 120 also is present. In embodiments, clock generation circuit 120 may be configured to generate one or more digital clocks under control of an included controller 125. While embodiments are not limited in this regard, clock generation circuit 120 may include so-called smart multiplexer circuitry. In an embodiment this smart multiplexer circuitry may take the form of a clock generation module such as described in U.S. Pat. No. 9,083,354, the disclosure of which is hereby incorporated by reference.

In an example, clock generation circuit 120 may generate a retimed clock from an incoming system clock signal, which in the embodiment shown in FIG. 1 is a clean clock signal (which may be received from a phase locked loop (PLL), e.g., a general purpose PLL). More particularly, clock generation circuit 120 may generate this retimed clock signal that can be dynamically controlled using the incoming clean clock signal and an incoming local oscillator (LO) clock signal, which may be received from a local oscillator. This local oscillator (not shown in FIG. 1) may provide one or more LO clock signals for use in various operations of the IC including in radio circuitry (which may use the LO clock signal for upconverting lower frequency signals to RF signals and downconverting RF signals to lower frequency signals).

Note that the output of clock generation circuit 120, namely the retimed clock, is provided both to MAC circuit 110 and interference mitigation circuit 130. While described and shown as a "retimed" signal, depending upon mode of operation, this retimed signal is more accurately an output clock signal from clock generation circuit 120, and may be provided in certain situations as the clean clock signal itself or a modified version of the clean clock signal as will be described further herein. Controller 125 may be configured to power down at least portions of clock generation circuit 120 when RF circuitry is inactive, to reduce power consumption, in some embodiments.

Still with reference to FIG. 1, certain internal circuitry of interference mitigation circuit 130 also is shown. As illustrated, MAC-processed data from MAC circuit 110, which is shown being output in differential form, is provided to corresponding latch circuits $132_{0,1}$ of interference mitigation circuit 130. As seen, latch circuits 132 are clocked using the retimed clock. After the data is latched, it is output to flip-flop circuitry $134_{0,1}$, namely D-type flip-flops that are clocked by the clean clock. In turn, flip-flops 134 output the differential data to PHY circuit 140, which conditions the MAC-processed data to output electrical signals on a physical link that couples PHY circuit 140 to a destination circuit, which may be on another integrated circuit, such as a host processor of a given system.

Note that in one implementation the I/O circuitry shown in FIG. 1 may be universal serial bus (USB) circuitry in accordance with a given USB specification, such as a USB 3.2 specification (September 2017). Of course other I/O circuitry may similarly leverage embodiments. While shown at this high level in the embodiment of FIG. 1, many variations and alternatives are possible. For example, while a direct bypass path between MAC circuit 110 and PHY circuit 140 is not shown, in some cases such bypass path may enable MAC-processed data to be directly provided to PHY circuit 140, thereby bypassing interference mitigation circuit 130. Such bypass path may be used for debug situations, or can be dynamically enabled when a given device does not seek to implement interference mitigation.

Figure 2:
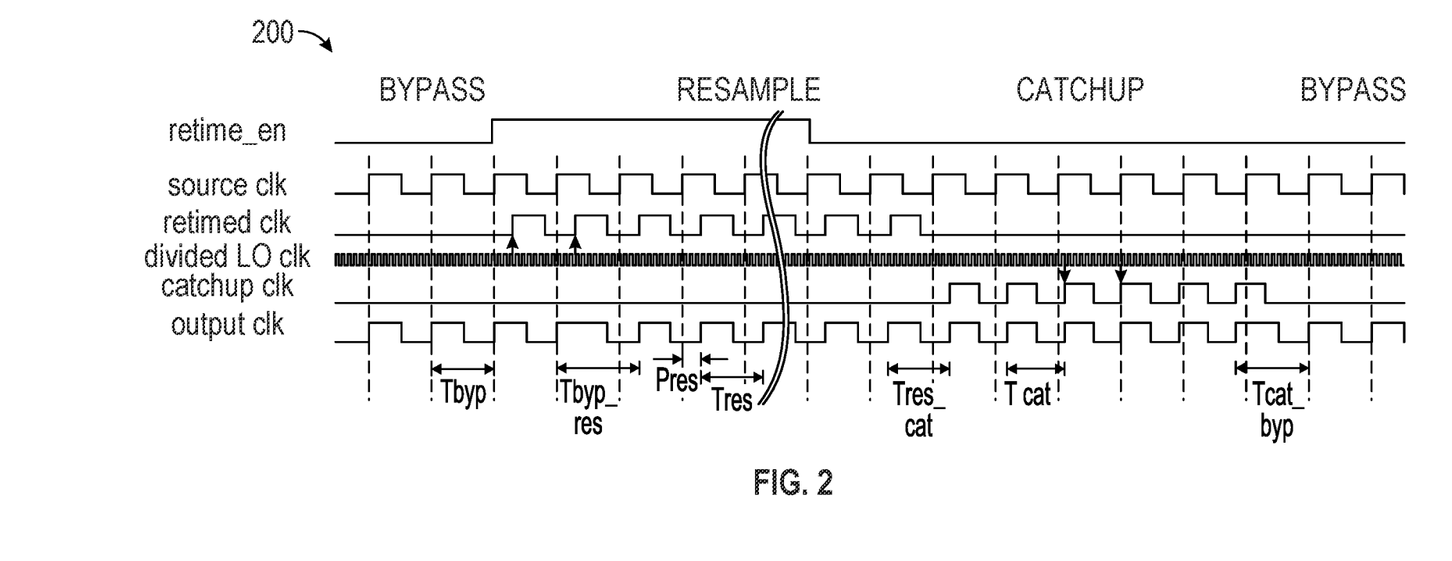
FIG. 2 is a timing diagram illustrating various control and clock signals in accordance with an embodiment.

Referring now to FIG. 2, shown is a timing diagram illustrating various control and clock signals that may be used within and generated by a clock generation circuit such as clock generation circuit 120 of FIG. 1. As illustrated in timing diagram 200, a source clock (source clk) is received within the clock generation circuit. This source clock may be any given clean clock signal such as an output signal of a PLL or any other clock generator. In one embodiment, this source clock signal may be received at a frequency of 48 MHz. As further shown, an output clock signal (output clk)

is output from the clock generation circuit, and may be used as a digital clock by various circuitry, including a MAC circuit and within an interference mitigation circuit, as two examples.

When an RF receiver is inactive, there may be no need for interference mitigation, and accordingly, the clock generation circuit may operate in a bypass mode in which a resampling enable signal (retime_en) is inactive, such that the source clock signal having a period of Tbyp is provided directly as the output clock.

Interference mitigation may be enabled by a driver such as an application programming interface (API). When the RF receiver is active, a resample mode may be initiated (when the resampling enable signal is active) in which this source clock signal is retimed to a retimed clock according to a received LO clock signal, namely a divided LO clock signal (divided LO clk) as shown. As illustrated, there is a single cycle time period (Tbyp_res) in which the output clock is extended for it to transition from the source clock to the retimed clock, which has a period of Tres (and a phase delay of Pres).

At the conclusion of RF receiver activity, a catchup mode may be entered where the output clock transitions from the retimed clock to a catchup clock, which has a higher frequency than the source clock, so that the timing may catchup when the phase between the catchup clock and the source clock match or at least substantially match. As illustrated, there is a single cycle time period (Tres_cat) in which the output clock is shortened for it to transition from the retimed clock to the catchup clock, which has a period of Tcat. When timing catches up, the source clock may again be provided as the output clock as the bypass mode is again entered within a single cycle time period (Tcat_byp).

In embodiments, a controller may control the clock generator by dynamically setting and clearing a RETIME enable indicator when entering or exiting radio receiver mode. By default, this RETIME enable indicator is clear and the clock generator starts in BYPASS mode. When the RETIME enable indicator is set, the clock generator starts resampling the input source clock and switches over to RESAMPLE mode. When the radio is being turned off, the RETIME enable indicator is cleared. To safely transition from RESAMPLE mode back to BYPASS mode without introducing clock glitches, the clock generator runs in a CATCHUP mode.

Thus in an embodiment, a clock generation circuit may have three modes:
  BYPASS: a clean clock signal is multiplexed through (active when the radio is off). Note that the clock generator can be left in BYPASS mode if digital interference mitigation is disabled.
  RESAMPLE: the clean clock signal is resampled with the divided LO clock such that the resampled clock is synchronized to the LO clock in order to avoid spurs while the radio is on, to provide for digital interference mitigation. In this mode, the output clock is phase shifted and lags the input source clock.
  CATCHUP: the clock frequency is increased, allowing for the clock phase to lead the source clock signal. In an embodiment in this catchup mode, the catchup clock is generated with the divided LO clock using an internal counter. This catchup clock frequency is faster than the source clock. For example, it may be at a 89.4 MHz or 100 MHz maximum clock frequency when the system clock frequency is 80 MHz; and 46 MHz maximum clock frequency when the system clock frequency is 40 MHz. In an embodiment, the minimum catchup frequency may be set to ensure that the CATCHUP mode duration is less than 10 us.

The timing diagram in FIG. 2 shows the effect of the output retimed clock across the different modes of operation. To best understand the impact, pay close attention to the output clock edges compared against the ideal clock source. During BYPASS, the output clock signal is lined up with the reference source clock signal. During RESAMPLE, the output clock signal is phase shifted and lags the source clock signal. During CATCHUP, the catchup clock frequency is faster than the source clock signal, and the phase gradually goes from lagging to leading the source clock. Once the clock is leading, the clock generation circuit switches back to BYPASS mode. The retimed clock and the catchup clock are both generated from the divided LO clk. The retimed clock is the synchronized version of the source clock, using the divided LO clock.

The jitter in each mode depends on the LO clock frequency. In an embodiment, the maximum frequency of the LO clock to the clock generator is 625 MHz, and any carrier frequency above 625 MHz may be divided. Understand while shown with this particular implementation of spur mitigation in FIG. 2, many variations and alternatives are possible.

Figure 3:
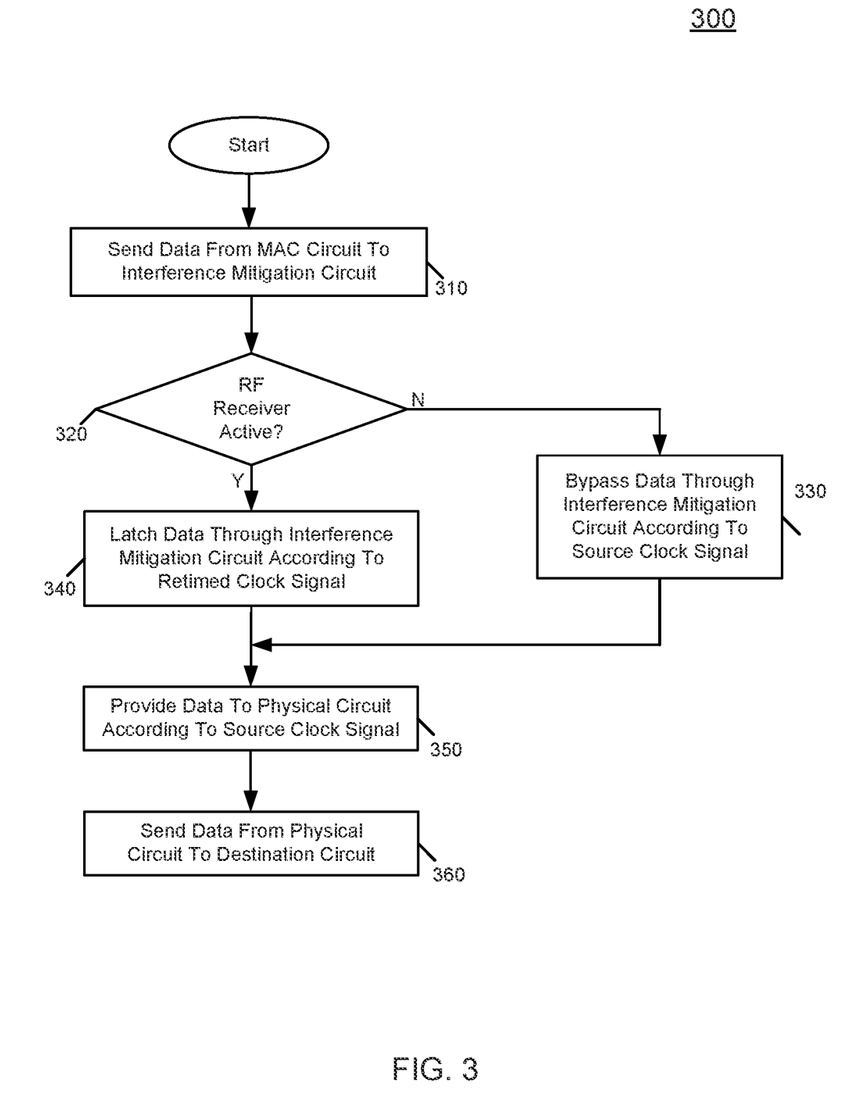
FIG. 3 is a flow diagram of a method in accordance with an embodiment.

Referring now to FIG. 3, shown is a flow diagram of a method in accordance with an embodiment. More specifically, as shown in FIG. 3 method 300 is a method for communicating digital data through an I/O interface while providing spur mitigation in accordance with an embodiment. As such, method 300 may be performed by hardware circuitry, including circuitry of an I/O interface, along with control circuitry and a clock generation circuit as described herein.

As illustrated, method 300 begins by sending data from a MAC circuit to an interference mitigation circuit (block 310). In one example, this data may be MAC-processed digital data that can be provided differentially, e.g., in a USB interface implementation. Next it is determined at diamond 320 whether an RF receiver is active. In an embodiment, this determination may be made by a controller such as a microcontroller (MCU) that controls operation in the IC.

If it is determined that there is no RF receiver activity, control passes to block 330 where the data may be handled within and bypassed through the interference mitigation circuit according to a source clock signal, which may be received from a clock generation circuit. Next at block 350 this data is provided from the interference mitigation circuit to a physical circuit according to the source clock signal. In turn, after physical layer processing, the data is sent to a destination circuit (block 360). In a USB implementation, the data may be sent via a USB link, e.g., present on a circuit board, to communicate the data to the destination circuit, which in one example may be a host processor of a system.

Still with reference to FIG. 3, if it is determined that there is RF receiver activity, control passes to block 340 where the data is handled within the interference mitigation circuit according to a retimed clock signal (e.g., phase delayed from the source clock signal). Such handling in this case includes latching the data using the retimed clock signal. In turn, at block 350 this data is provided from the interference mitigation circuit to a physical circuit according to the source clock signal, and after physical layer processing, the data is sent to the destination circuit (block 360). Understand while shown at this high level in FIG. 3, alternatives and variations are possible.

Figure 4:
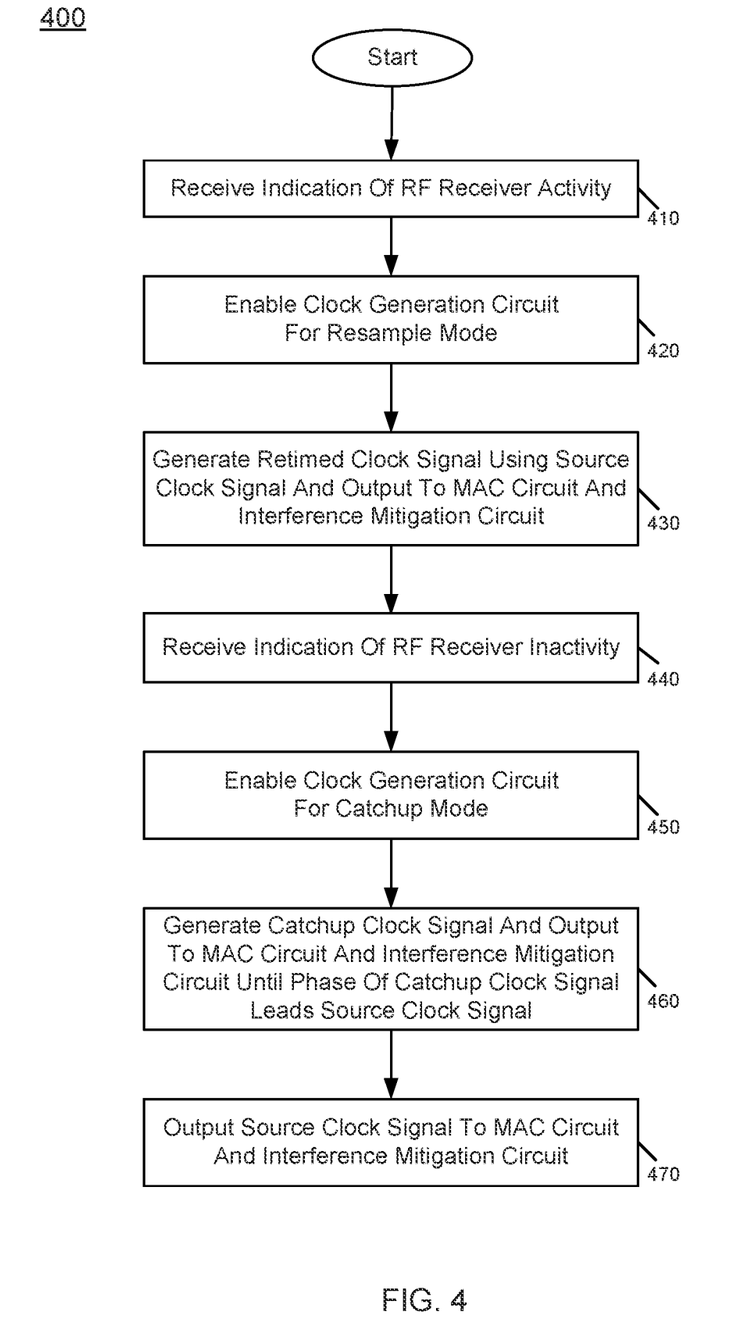
FIG. 4 is a flow diagram of a method in accordance with another embodiment.

Referring now to FIG. 4, shown is a flow diagram of a method in accordance with another embodiment. More specifically, as shown in FIG. 4 method 400 is a method for controlling a clock generation circuit to enable spur mitigation in accordance with an embodiment. As such, method 400 may be performed by hardware circuitry, such as a main controller of an IC.

As illustrated, method 400 begins by receiving an indication of RF receiver activity (block 410). In response to this indication, the controller may enable the clock generation circuit for a resample mode (block 420). This is the case, as in this situation interference mitigation is desired in light of this RF receiver activity. Accordingly, control next passes to block 430 where a retimed clock signal may be generated within the clock generation circuit. The retimed clock signal, which is generated using the source clock signal, may be output to the MAC circuit and the interference mitigation circuit, which use this signal as discussed herein.

Next, after the conclusion of RF activity, control passes to block 440 where an indication of RF receiver inactivity may be received. In response to this indication, at block 450 the controller may enable the clock generation circuit for a catchup mode. In this catchup mode, a catchup clock signal may be generated within the clock generation circuit. The catchup clock signal, which may be generated using counter circuitry within the clock generation circuit, may be output to the MAC circuit and the interference mitigation circuit until the phase of this catchup clock signal leads the source clock signal (block 460).

Finally, after this catchup mode, the controller may cause the clock generation circuit to enter into a bypass mode in which it outputs the source clock signal to the MAC circuit and the interference mitigation circuit such that the data may be passed through from the MAC circuit through the interference mitigation circuit to the physical circuit using a clean clock signal (block 470). Understand while shown at this high level in the embodiment of FIG. 4, many variations and alternatives are possible.

In some implementations, interference mitigation can be enabled with certain limitations on system and radio carrier frequencies. For example, when using a 2.4 GHz radio, a system clock can run up to 80 MHz with any radio carrier frequency between 2.4 GHz and 2.5 GHz. In another implementation, when using a sub-GHz radio, the system clock may be limited to frequencies below 40 MHz in order to enable interference mitigation. In some cases, radio carrier frequencies may have limitations in certain bands. In one embodiment, non-supported frequency ranges are listed in Table 1.

TABLE 1

| Range | RF Frequency Low Limit | RF Frequency High Limit |
|---|---|---|
| 1 | — MHz | 120.4 MHz |
| 2 | 138 MHz | 160.4 MHz |
| 3 | 184 MHz | 200.4 MHz |
| 4 | 230 MHz | 240.4 MHz |
| 5 | 276 MHz | 280.4 MHz |

The extent and duration of perturbations on a mitigated clock signal may depend on several factors, including radio carrier frequency and system clock frequency. In embodiments main perturbation characteristics may include: enabling and disabling the radio may result in a one-time clock pulse extension (e.g., on the order of 7 ns); while the radio is running, the system frequency may be phase shifted and have a cycle-to-cycle clock jitter (e.g., on the order of 1 to 2 ns); and system clock frequency may increase for a small duration when radio is disabled (e.g., not to exceed the duration listed in Table 2).

TABLE 2

| Range | Radio Carrier Frequency Low Range | Radio Carrier Frequency High Range | Max Duration of Increased Frequency | Max Frequency (40 MHz baseline) | Max Frequency (80 MHz baseline) |
|---|---|---|---|---|---|
| 1 | — | 322 MHz | 10 us | 46 MHz | NA |
| 2 | 322 MHz | 2.4 GHz | 2 us | 46 MHz | NA |
| 3 | 2.4 GHz | 2.5 GHz | 0.1 us | 46 MHz | 89 MHz |

In a particular implementation, an I/O circuit of an IC may run full speed USB (FS USB) communications in the presence of an operating radio circuit (which may be a short range or wide area radio) and not cause interference in the radio.

In a USB implementation, a USB MAC clock can be retimed with the LO clock from the radio using a clock generation circuit in accordance with an embodiment. This enables the components of the USB 48 MHz clock to be spread out of the band used at that time by the radio. Since USB specifications have stringent frequency rules (e.g., 2.5% tolerance), the data is resynchronized back to the 48 MHz clock (e.g., in interference mitigation circuitry). By retiming and resynchronizing, noise components generated by the USB communications are dynamically moved outside of the radio bands of interest. This allows for seamless USB operation with the radio with no deleterious effects.

Stated another way, retiming reduces spurs on the radio signal by shifting the internal digital clock from the radio carrier frequency. This notch filter is achieved by resampling the system clocks to the divided down radio clock inside the clock generator.

Figure 5:
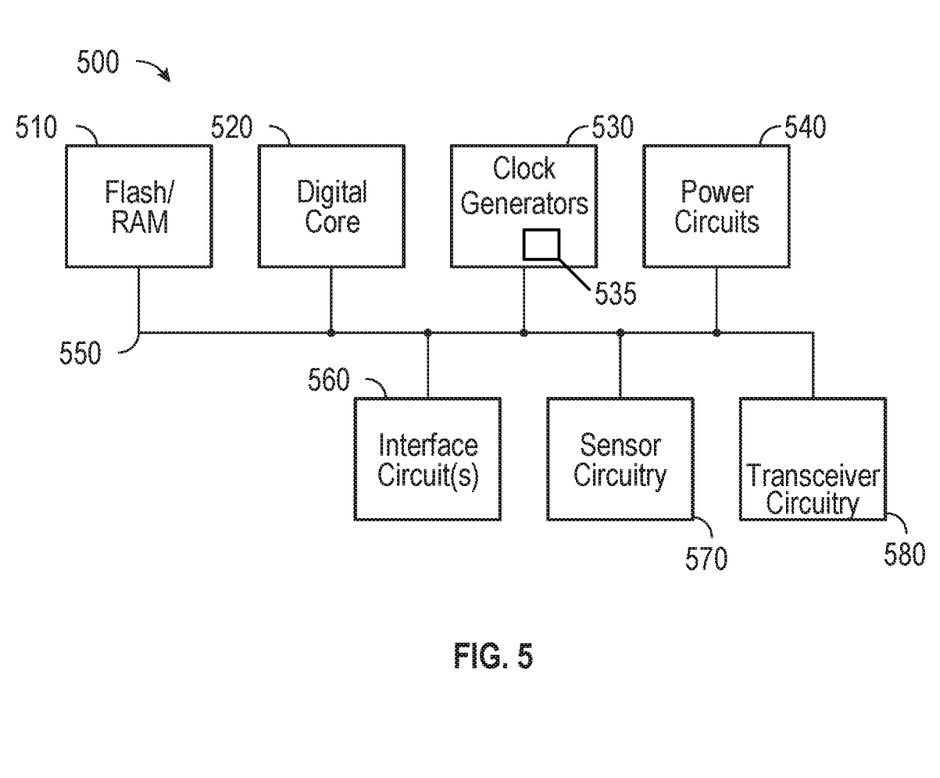
FIG. 5 is a block diagram of a representative integrated circuit in accordance with an embodiment.

Referring now to FIG. 5, shown is a block diagram of a representative integrated circuit 500 which may include interference mitigation circuitry as described herein. In the embodiment shown in FIG. 5, integrated circuit 500 may be, e.g., a microcontroller, wireless transceiver or other device that can be used in a variety of use cases, including sensing, metering, monitoring, embedded applications, communications, applications and so forth, and which may be particularly adapted for use in an IoT device.

In the embodiment shown, integrated circuit 500 includes a memory system 510 which in an embodiment may include a non-volatile memory such as a flash memory and volatile storage, such as RAM. In an embodiment, this non-volatile memory may be implemented as a non-transitory storage medium that can store instructions and data. Such non-volatile memory may store instructions, including instructions for controlling operation of a clock generator and interference mitigation circuitry with retiming and resynchronization, e.g., on RF circuitry activity as described herein.

Memory system 510 couples via a bus 550 to a digital core 520, which may include one or more cores and/or microcontrollers that act as a main processing unit of the integrated circuit. In turn, digital core 520 may couple to clock generators 530 which may provide one or more phase locked loops or other clock generation circuitry to generate various clocks for use by circuitry of the IC. As shown, clock generators 530 may include a clock generator 535, which may generate a retimed signal using a source clock signal and a LO signal as described herein.

As further illustrated, IC 500 further includes power circuitry 540, which may include one or more voltage regulators. Additional circuitry may optionally be present depending on particular implementation to provide various functionality and interaction with external devices. Such circuitry may include interface circuitry 560 which may provide interface with various off-chip devices, sensor circuitry 570 which may include various on-chip sensors including digital and analog sensors to sense desired signals, such as for a metering application or so forth.

In addition as shown in FIG. 5, transceiver circuitry 580 may be provided to enable transmission and receipt of wireless signals, e.g., according to one or more of a local area or wide area wireless communication scheme, such as Zigbee, Bluetooth, IEEE 802.11, IEEE 802.15.4, cellular communication or so forth. When receiver activity of transceiver circuitry 580 is present, interference mitigation as described herein may be performed. Understand while shown with this high level view, many variations and alternatives are possible.

Note that ICs such as described herein may be implemented in a variety of different devices such as IoT device. This IoT device may be a smart utility meter for use in a smart utility network, e.g., a mesh network in which communication is according to an IEEE 802.15.4 specification.

Figure 6:
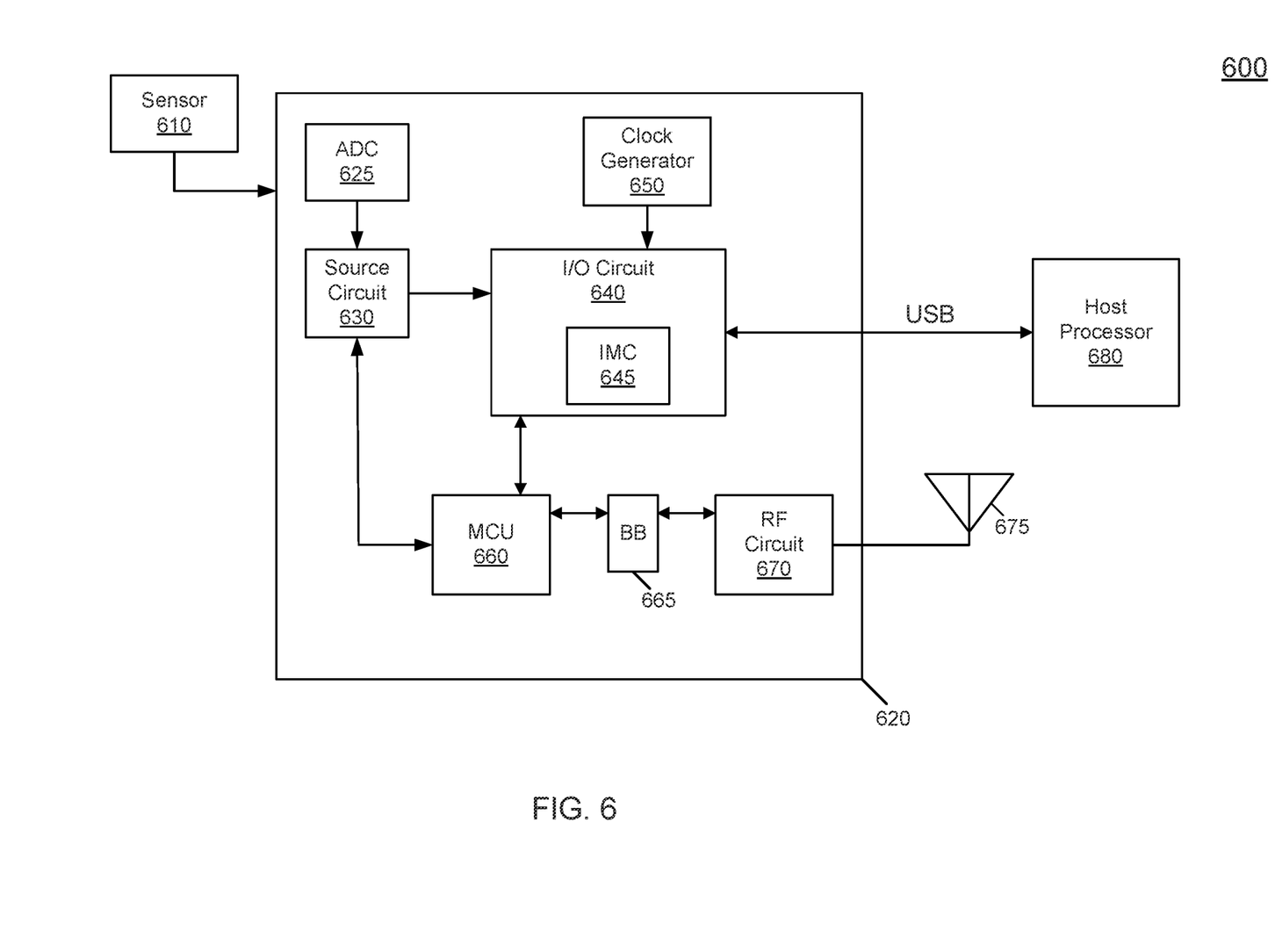
FIG. 6 is a block diagram of a system in accordance with an embodiment.

Referring now to FIG. 6, shown is a block diagram of a system in accordance with an embodiment. As shown in FIG. 6, system 600 may be a given computing system such as an embedded system, e.g., a smart meter to meter a utility at a residence, business or so forth. In the high level shown in FIG. 6, a representative sensor 610 is shown. Sensor 610 may sense a flow rate of a given metered media such as natural gas, water or so forth. Understand that there may be multiple sensors 610. In any case, sensor 610 couples to an integrated circuit 620. In embodiments herein, IC 620 may digitize incoming sensed information via an analog-to-digital converter 625 and provide the digitized information to a source circuit 630. Source circuit 630 provides the digitized information to an I/O circuit 640, which may communicate this information, e.g., via a USB link that couples to a host processor 680. As further shown, IC 620 also includes a microcontroller unit (MCU) 660, which may control various components within IC 620, including source circuit 630 and I/O circuit 640.

As further shown, an RF circuit 670 may communicate RF information via an antenna 675 that couples to IC 620. In a receive direction, RF circuit 670 may process incoming RF signals and provide lower frequency, e.g., baseband, signals to a baseband circuit 665 that in turn is coupled to MCU 660. In embodiments herein, when RF circuit 670 is active, MCU 660 may cause I/O circuit 640 to perform interference mitigation as described herein. To this end, I/O circuit 640 includes an interference mitigation circuit 645. In embodiments herein, interference mitigation circuit 645 may resynchronize data that has been retimed according to a retimed clock received from a clock generator 650 to a USB clock, such as a 48 MHz USB clock. After I/O circuit 640 processes the retimed and resynchronized data, it sends it via the USB link to host processor 680. Understand while shown at this high level in the embodiment of FIG. 6, many variations and alternatives are possible.

Figure 7:
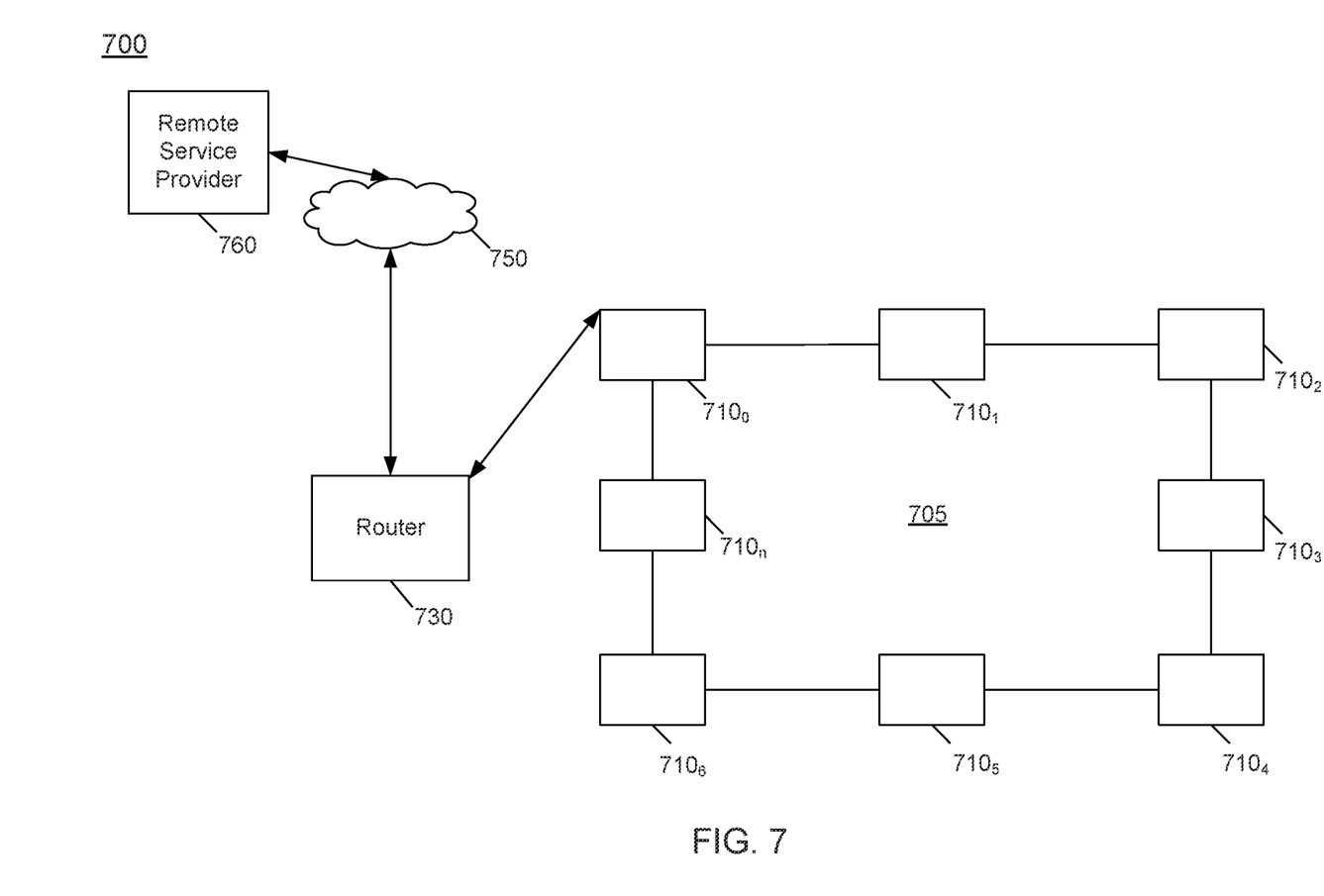
FIG. 7 is a high level diagram of a network in accordance with an embodiment.

Referring now to FIG. 7, shown is a high level diagram of a network in accordance with an embodiment. As shown in FIG. 7, a network 700 includes a variety of devices, including smart devices such as IoT devices, routers and remote service providers. In the embodiment of FIG. 7, a mesh network 705 may be present, e.g., in a neighborhood having multiple IoT devices $710_{0-n}$. Such IoT devices may enable concurrent digital I/O activity and RF receiver activity using retiming and resynchronization as described herein. As shown, at least one IoT device 710 couples to a router 730 that in turn communicates with a remote service provider 760 via a wide area network 750, e.g., the internet. In an embodiment, remote service provider 760 may be a backend server of a utility that handles communication with IoT devices 710. Understand while shown at this high level in the embodiment of FIG. 7, many variations and alternatives are possible.

Embodiments may thus reduce interference while enabling digital circuitry and RF circuitry to operate concurrently. Instead without an embodiment, interference is otherwise mitigated by time multiplexing radio circuitry and digital circuitry (or at least I/O circuitry such as USB circuitry) so that they do not operate concurrently. In addition by using an embodiment, complex frequency planning to prevent certain radio bands from activity, where these bands contain interfering frequency components (such as harmonics of a USB 48 MHz clock) can be avoided.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
    a radio frequency (RF) receiver to receive an RF signal;
    a media access control (MAC) circuit to receive data and output MAC-processed data according to a clock signal that is phase delayed with respect to a source clock signal when the RF receiver is active; and
    an interference mitigation circuit to receive the MAC-processed data and provide the MAC-processed data to a physical circuit resynchronized to the source clock signal.

2. The apparatus of claim 1, wherein the interference mitigation circuit comprises:
    a latch to latch the MAC-processed data according to the phase-delayed clock signal when the RF receiver is active; and
    a flop coupled to the latch to clock the MAC-processed data according to the source clock signal.

3. The apparatus of claim 2, wherein when the RF receiver is inactive, the latch is to latch the MAC-processed signal according to the source clock signal.

4. The apparatus of claim 1, further comprising a clock generation circuit to receive the source clock signal and to output the phase-delayed clock signal.

5. The apparatus of claim 4, further comprising a controller to cause at least a portion of the clock generation circuit to be powered down when the RF receiver is inactive.

6. The apparatus of claim 4, wherein in a first mode when the RF receiver is inactive, the clock generation circuit is to output the source clock signal to the MAC circuit and the interference mitigation circuit.

7. The apparatus of claim 6, wherein in a second mode when the RF receiver is active, the clock generation circuit is to output the phase-delayed clock signal to the MAC circuit and the interference mitigation circuit.

8. The apparatus of claim 7, wherein in a third mode after the RF receiver becomes inactive after being active, the clock generation circuit is to output a catchup clock signal to the MAC circuit and the interference mitigation circuit, the catchup clock signal having a higher frequency than the source clock signal.

9. The apparatus of claim 4, wherein the clock generation circuit is to switch between an output of the source clock signal and the output of the phase-delayed clock signal in a single cycle.

10. The apparatus of claim 4, wherein the clock generation circuit is to retime the source clock signal according to a local oscillator clock signal to generate the phase-delayed clock signal.

11. A method comprising:
sending data from a media access control (MAC) circuit of an integrated circuit (IC) to an interference mitigation circuit of the IC;
handling the data in the interference mitigation circuit according to a phase-delayed clock signal when a radio frequency (RF) receiver of the IC is active, and handling the data in the interference mitigation circuit according to an undelayed clock signal when the RF receiver is inactive; and
forwarding the data from the interference mitigation circuit to a physical circuit of the IC according to the undelayed clock signal.

12. The method of claim 11, further comprising receiving the phase-delayed clock signal from a clock generation circuit of the IC.

13. The method of claim 12, further comprising phase delaying the undelayed clock signal in the clock generation circuit according to a local oscillator clock signal, the local oscillator clock signal used in the RF receiver.

14. The method of claim 11, further comprising:
latching the data through a latch of the interface mitigation circuit according to the phase-delayed clock signal when the RF receiver is active; and
outputting the data from a flop circuit of the interference mitigation circuit according to the undelayed clock signal.

15. The method of claim 11, further comprising preventing interference between the undelayed clock signal and activity in the RF receiver via the phase-delayed clock signal.

16. The method of claim 11, further comprising sending the data from the physical circuit to a host processor coupled to the IC via a universal serial bus (USB) link.

17. A system comprising:
a host processor; and
an integrated circuit coupled to the host processor via a link, the integrated circuit comprising:
a radio frequency (RF) receiver to receive an RF signal; and
an input/output (I/O) circuit to communicate with the host processor via the link, the I/O circuit comprising:
a media access control (MAC) circuit to receive data and output MAC-processed data according to a retimed clock signal;
a physical circuit coupled to the MAC circuit, the physical circuit to condition the MAC-processed data and output the conditioned MAC-processed data via the link; and
an interference mitigation circuit to receive the retimed clock signal and a source clock signal and resynchronize the MAC-processed data to the source clock signal.

18. The system of claim 17, further comprising a clock generation circuit to generate the retimed clock signal using the source clock signal and a local oscillator clock signal used by the RF receiver.

19. The system of claim 18, wherein when the RF receiver is inactive, the clock generation circuit is to output the source clock signal as the retimed clock signal.

20. The system of claim 17, wherein the interference mitigation circuit comprises:
a latch to latch the MAC-processed data according to the retimed clock signal; and
a flop coupled to the latch to clock the MAC-processed data according to the source clock signal.

* * * * *